United States Patent [19]

Liu et al.

[11] Patent Number: 5,094,984
[45] Date of Patent: Mar. 10, 1992

[54] SUPPRESSION OF WATER VAPOR ABSORPTION IN GLASS ENCAPSULATION

[75] Inventors: Charles C. Liu; Krzysztof Nauka, both of Mt. View, Calif.

[73] Assignee: Hewlett-Packard Company, Palo Alto, Calif.

[21] Appl. No.: 722,363

[22] Filed: Jun. 25, 1991

Related U.S. Application Data

[63] Continuation of Ser. No. 597,260, Oct. 12, 1990, abandoned.

[51] Int. Cl.⁵ .............................................. H01L 29/34
[52] U.S. Cl. .................................. 437/235; 437/238; 437/240; 437/982; 148/DIG. 43; 148/DIG. 133; 357/52; 357/54
[58] Field of Search .................. 65/60.2, 60.5; 427/51; 357/52, 54; 437/235, 238, 240, DIG. 982; 148/DIG. 43, DIG. 133

[56] References Cited

U.S. PATENT DOCUMENTS

| | | | |
|---|---|---|---|
| 4,097,889 | 6/1978 | Kern et al. | 357/54 |
| 4,628,590 | 12/1986 | Udo et al. | 357/54 X |
| 4,708,884 | 11/1987 | Chandross et al. | 427/39 |
| 4,835,597 | 5/1989 | Okuyama et al. | 357/52 |
| 4,879,253 | 11/1989 | Wakamatsu et al. | 437/41 |
| 4,903,117 | 2/1990 | Okamoto et al. | 357/71 |

OTHER PUBLICATIONS

"VLSI Fabrication Principles", Ghandhi, Wiley & Sons, New York, 3/1987, pp. 424-429.

I. Avigal, Solid State Technology, Oct. 1983, pp. 217-224.
W. Kern and R. K. Smeltzer, Solid State Technology, Jun. 1985, pp. 171-179.
D. S. Williams and E. A. Dein, Solid State Science and Technology, vol. 134, (1987), pp. 657-664.
Y. H. Tsai et al., Intl. Symp. on VLSI Technology, Systems and Applications, (May 1989).
K. Law et al., Solid State Technology, Apr. 1983, pp. 60-62.

Primary Examiner—Robert L. Lindsay
Attorney, Agent, or Firm—Peter P. Tong

[57] ABSTRACT

A method for encapsulation of an integrated circuit array that suppresses or eliminates absorption and subsequent out-gassing of water vapor and suppresses or eliminates out-gassing of toxic constituents of the encapsulation layer such as trimethyl borate. A first layer of borophosphosilicate glass is deposited on the integrated circuit array, followed immediately by deposit of a thin cap layer of undoped oxide of silicon. The method also allows use of boron and phosphorous concentrations in the borophosphosilicate glass as high as 9 weight percent with no loss of stability of that layer, before or after thermal treatment. Reflow processing temperatures as low as $T_r = 700°-900°$ C. may be used here. Alternatively, silicon nitride can replace the silicon oxide in the cap layer, using either a high temperature process or a lower temperature plasma-enhanced process.

12 Claims, 5 Drawing Sheets

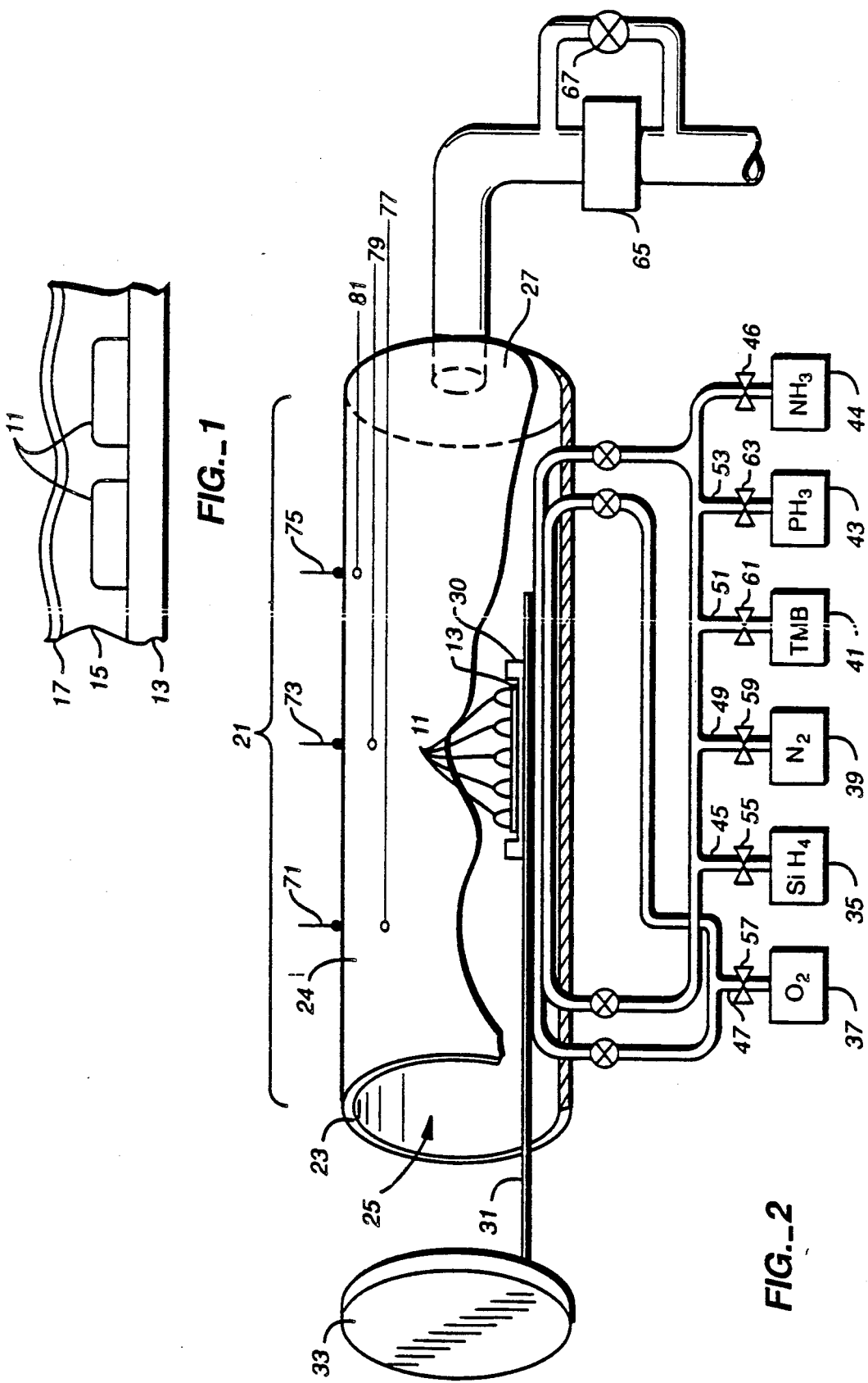
FIG._1
FIG._2

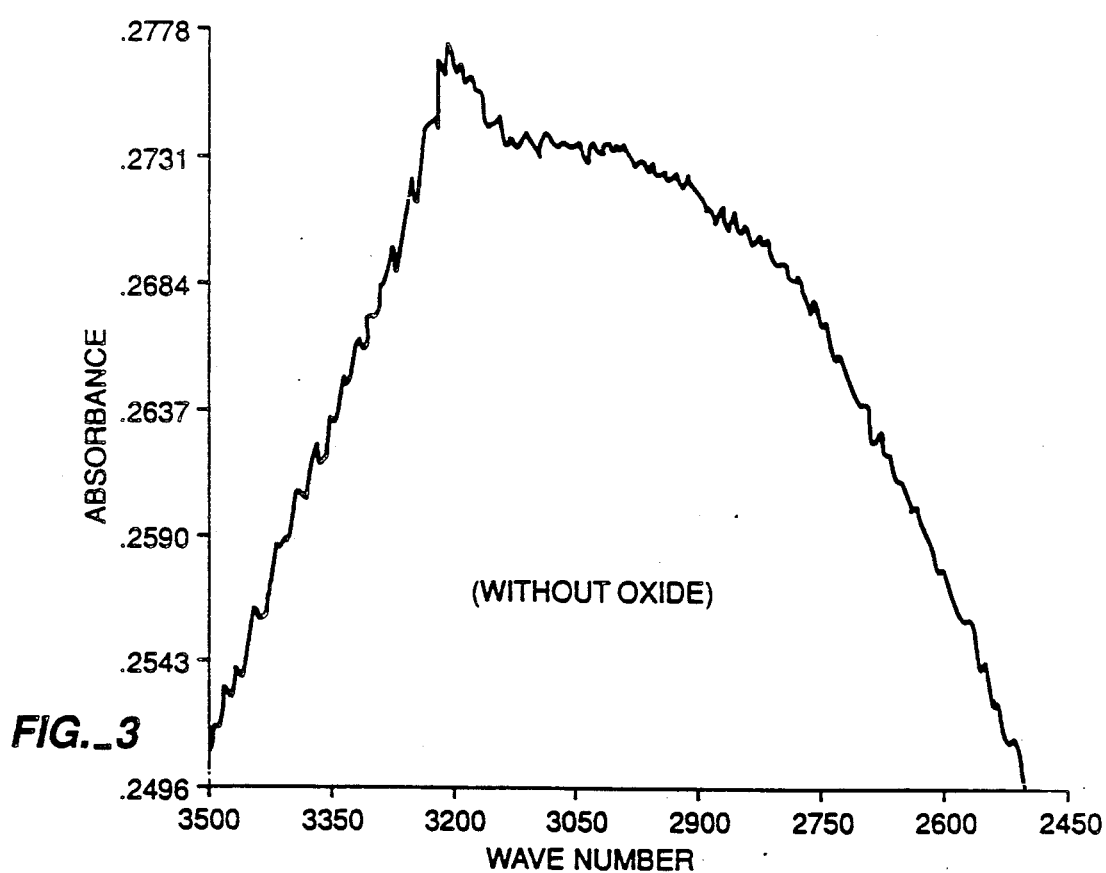
FIG._3
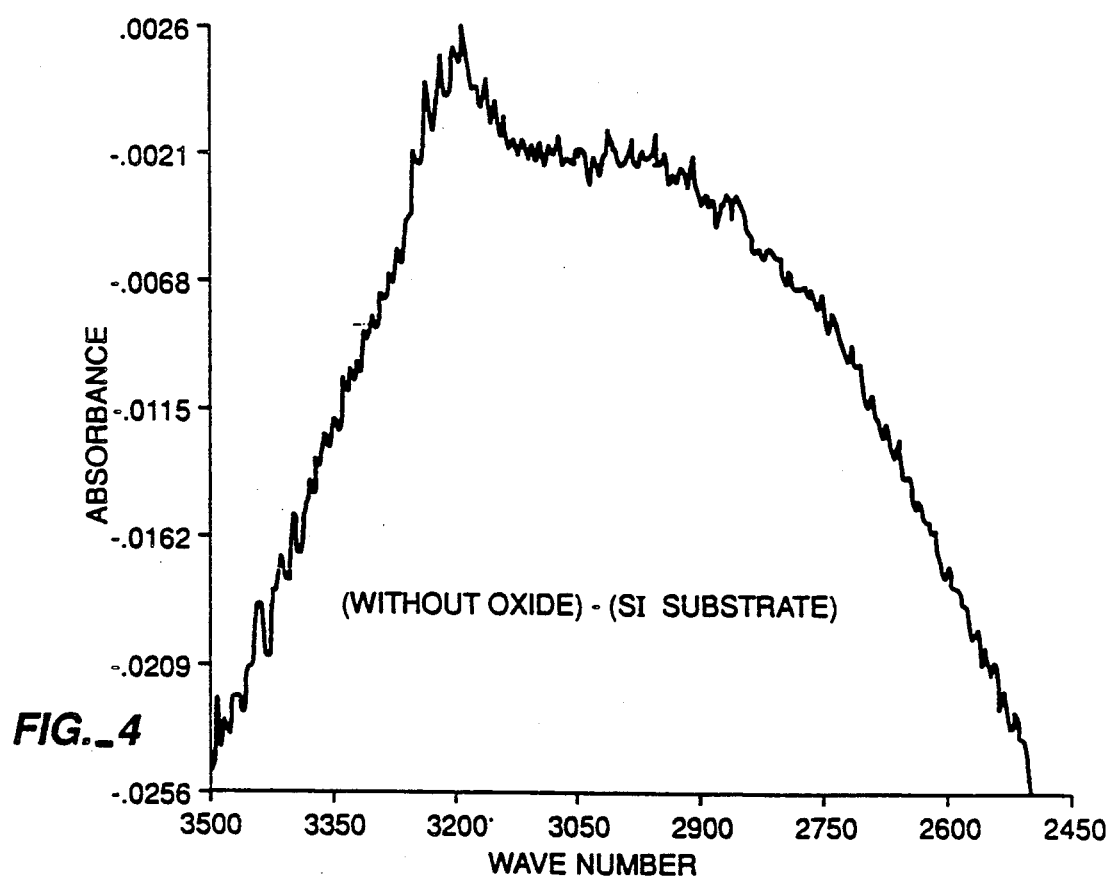
FIG._4

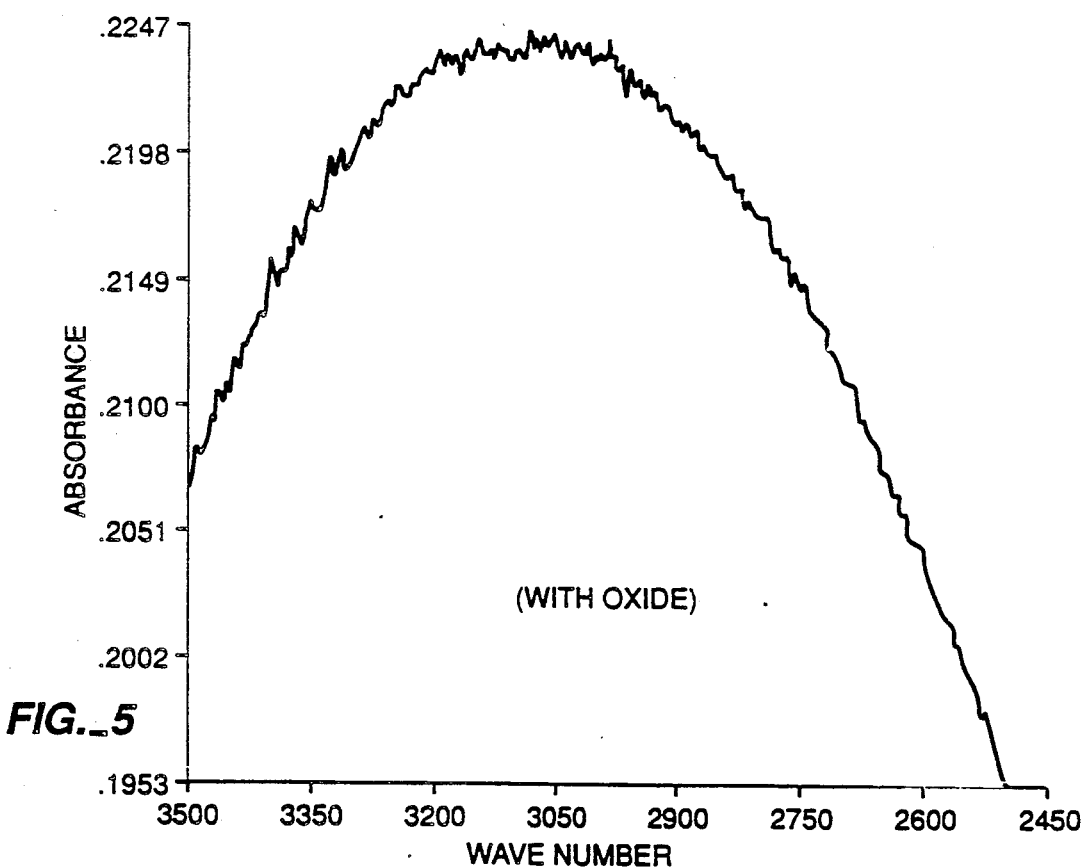
FIG._5
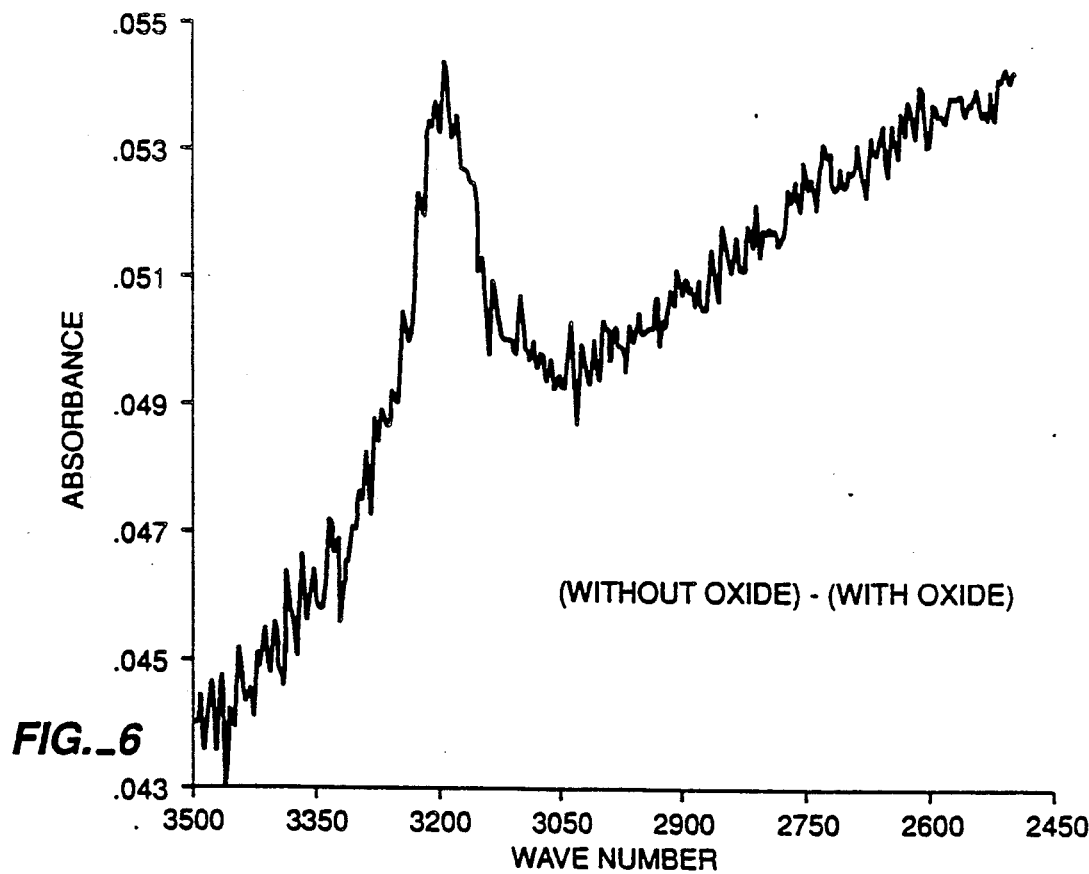
FIG._6

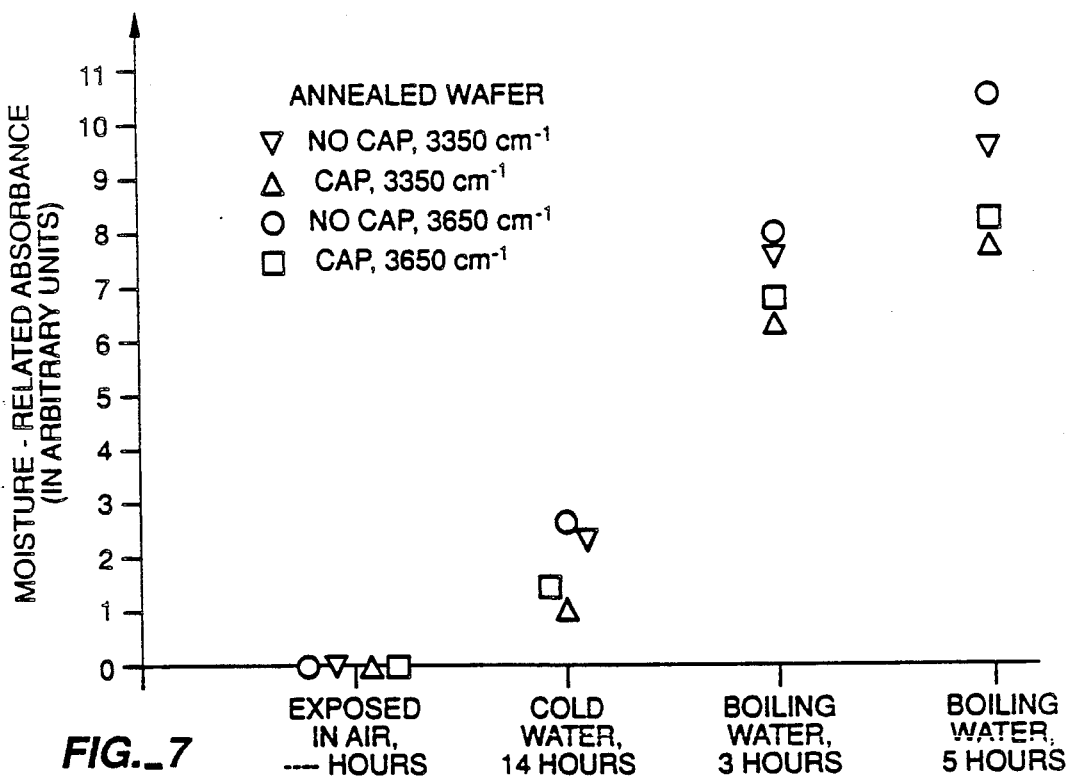
FIG._7
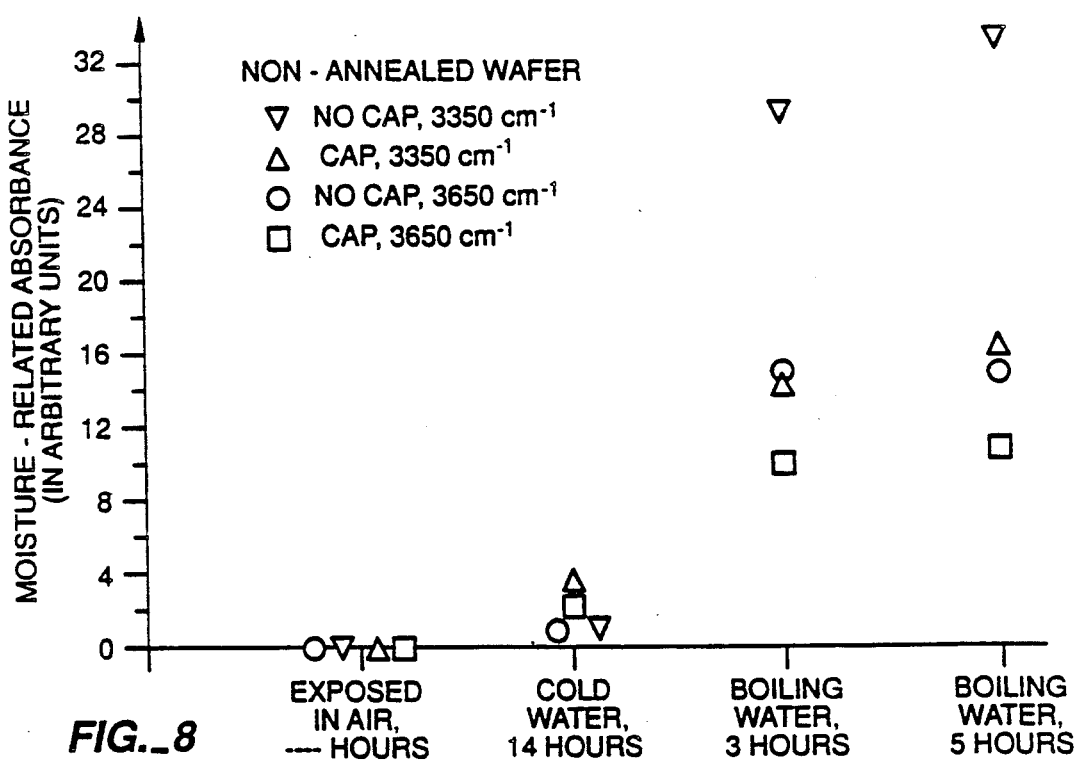
FIG._8

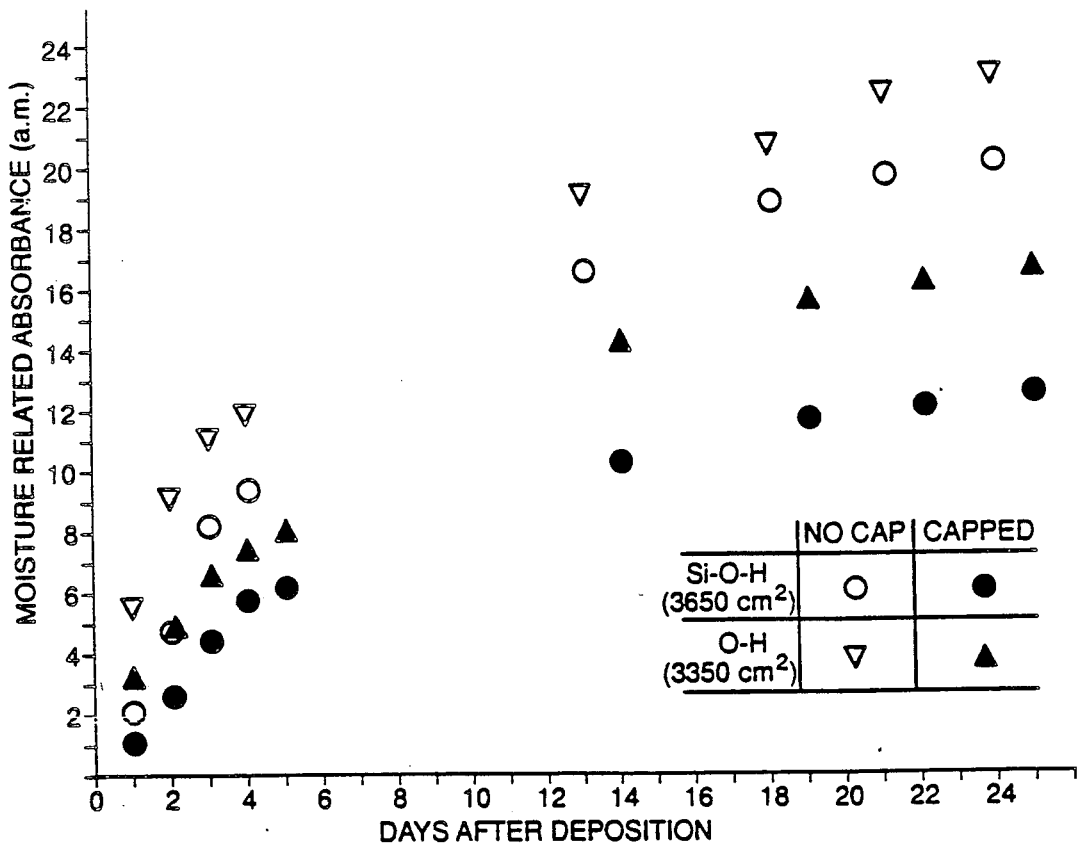
FIG._9
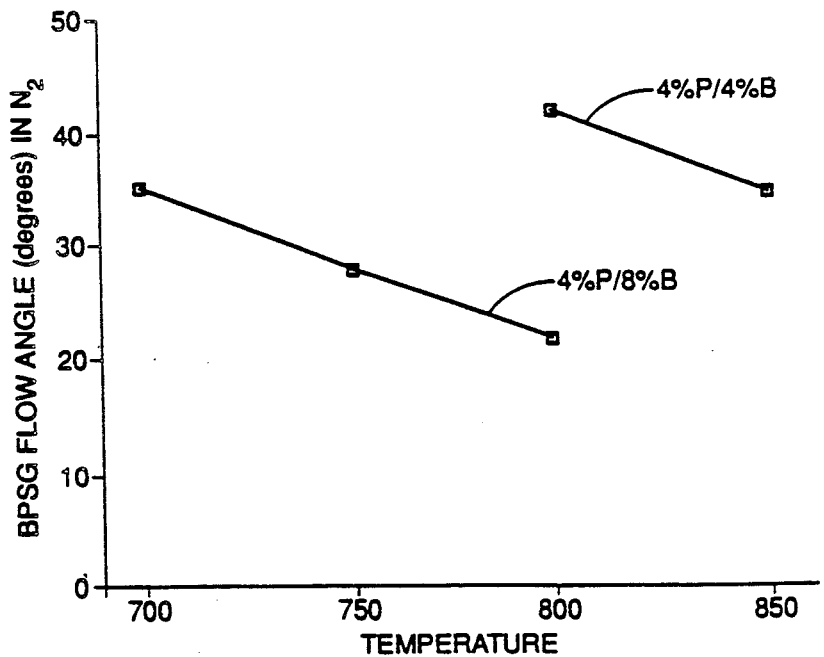
FIG._10

SUPPRESSION OF WATER VAPOR ABSORPTION IN GLASS ENCAPSULATION

CROSS REFERENCE TO RELATED APPLICATION

This is a continuation of copending application Ser. No. 07/597,260 filed on Oct. 12, 1990, now abandoned.

DESCRIPTION

1. Technical Field

This invention relates to suppression of water vapor absorption in a glass encapsulation layer for electronic components.

1. Background Art

Semiconductor electronic components, or arrays of such components, are often encapsulated in a glass or similar passivation layer in order to chemically, mechanically and electronically insulate the enclosed array from the environments the package will pass through before or during the time the array is tested and/or used for its chosen task. Glasses such as borophosphosilicate glass ("BPSG") is often used as a passivation layer or interlayer dielectric film because (1) the passivation material has a substantially lower reflow temperature than most other suitable passivation materials and (2) the presence of boron and phosphorus atoms in approximately equal concentration in the passivation layer material ensures that such material will not produce a net n type or p type average carrier density of substantial magnitude ($>10^{14}$ cm$^{-3}$). However, borophosphosilicate glass ("BPSG") readily absorbs and emits water vapor so that, when a BPSG passivation layer is used by itself, water vapor is absorbed and emitted by this passivation material depending upon the temperature and vapor pressure of the environment.

Chemical vapor deposition ("CVD") of borophosphosilicate glass at temperatures below 600° C. is disclosed in U.S. Pat. No. 4,708,884, issued to Chandross et al., using decomposition of complex compounds such as diacetoxyditertiarybutoxysilane.

Okuyoma et al., in U.S. Pat. No. 4,835,597, disclose provision of a phosphosilicate glass film having a low phosphorus concentration on an underlying borophosphosilicate glass film for purposes of environmental insulation.

A high temperature process, requiring temperatures of at least T=940° C., for forming a borophosphosilicate glass film on a semiconductor substrate, is disclosed by Wakematsu et al. in U.S. Pat. No. 4,879,253. The glass film has a high and precisely defined concentration of both boron and phosphorus.

In U.S. Pat. No. 4,903,117, issued to Okamoto et al., formation of a silicon oxide film and a borophosphosilicate film on a silicon substrate is disclosed. A metal film, positioned adjacent to the BPSG film, prevents dopant impurities such as boron and phosphorus from defusing from the BPSG film to another material positioned on the other side of the metal film.

Avigal, in "Inter-metal Dielectric and Passivation-related Properties of Plasma BPSG", Solid State Technology, October, 1983, pp. 217-224, has discussed the use of phosphosilicate glass ("PSG") and BPSG versus undoped glass as a passivation layer for integrated circuit ("IC") materials. Phosphorous acts as an ion getter for sodium ions and is preferred over undoped glass. However, PSG is highly hygroscopic and has relatively high porosity that appears to increase with increasing phosphorous content. This often limits the phosphorous content in PSG to no more than 4-5 weight percent. If these problems are somehow avoided, photoresist adhesion problems in PSG further limit the phosphorous content to 8-9 weight percent. Boron concentration in BPSG is also limited to 4-5 weight percent. Increasing the boron concentration in BPSG decreases the compressive stress therein that is produced by the presence of phosphorous and has other advantages. Reflow of as-deposited BPSG improves the coverage of the underlying IC structure and is usually performed at temperatures of T=800°-1100° C. Reflow in BPSG increases with increasing phosphorous content and increases markedly with increasing boron concentration, even if the phosphorous concentration is decreased correspondingly. Reflow also increases with increasing reflow temperature, but at higher temperatures (T≧1000° C.) large, undesirable bubbles or voids appear at steps in the underlying IC structure. Glass deposition by atmospheric pressure chemical vapor deposition ("APCVD"), by low pressure deposition ("LPCVD") and by plasma enhanced deposition ("PECVD") are discussed.

Kern and Smeltzer, in "Borophosphosilicate Glasses for Integrated Circuits", Solid State Technology, June, 1985, pp. 171-179, note that, although increasing the boron and phosphorous concentrations above 4-5 weight percent each allow reduction of the glass fusion temperature to as low as T=600° C., the presence of boron concentration above 5 weight percent produces unstable glass that forms microcrystals of metaboric acid or for which the bulk glass layer separates from the surface glass layer. These workers recommend densification or porosity reduction in the BPSG layer by annealing at a temperature T=700°-800° C. for 15-30 minutes immediately after formation of the BPSG layer, in order to suppress these undesirable tendencies. These workers also note that increasing the phosphorous or boron content by 1 weight percent and 1 weight percent allows decrease of the reflow temperature by ΔT=20° C. and ΔT=40° C., respectively. Although increasing the boron concentration has a much greater effect on glass reflow properties than does increasing the phosphorous concentration by the same amount, the BPSG layer becomes unstable with boron concentration higher than about 4 weight percent. These results are confirmed by results of Williams and Dein, reported in Solid State Science and Technology, vol. 134 (1987) pp. 657-664, by results of Tsai et al., reported in Intl. Symp. on VLSI Technology, Systems and Appls. (May, 1989), and by results of Law et al., reported in Solid State Technology, April, 1983, pp. 60-62.

What is needed is a means of treating a borophosphosilicate film to provide a thin layer of material that suppresses inflow to, or outflow from, the borophosphosilicate glass film of undesirable compounds such as water vapor and allows higher boron and phosphorous concentrations to be used in the BPSG layer. Preferably, the BPSG post-process treatment should be performable at relatively low temperatures, under T=500° C.

SUMMARY OF THE INVENTION

These needs are met by a process that forms a layer of borophosphosilicate glass of thickness at least 0.7 μm over an integrated circuit array, followed immediately by formation of a layer of undoped oxide of silicon, of approximately 100 Å to 500 Å thick, over the BPSG layer. Formation of the BPSG layer and the undoped silicon oxide layer occurs at a relatively low temperature of between 300° C. and 450° C. Higher temperatures can also be used, if desired. Because the silicon oxide layer is formed as an integral part of the overall process that also deposits the BPSG layer, water vapor that would otherwise be absorbed by the BPSG layer from the environment has no chance to be absorbed before the silicon oxide layer is laid down. The undoped silicon oxide layer may be relatively thin but suppresses substantially all movement of water vapor through itself. This might not be true if the silicon oxide film contained even a modest percentage of either of the dopants boron or phosphorus because the presence of these dopants facilitates diffusion in silicon oxide by other impurities.

BRIEF DESCRIPTION OF THE DRAWINGS

FIG. 1 is a side view of a portion of the substrate/IC array, after encapsulation according to the invention.

FIG. 2 is a schematic view of apparatus used to practice one embodiment of the invention.

FIGS. 3-6 are graphs of measured absorbance, or calculated absorbance differences, versus wavenumber of the light used, for different configurations of semiconductor substrate plus BPSG passivating layer with and without the undoped oxide layer prepared according to the invention. These figures were obtained for the BPSG layers with "standart", i.e. approximately 4 weight percent B and 4 weight percent P.

FIGS. 7, 8 and 9 are graphs of measured absorbance for capped and uncapped BPSG layers with "high" B content (layers containing approximately 8 weight percent B and 4 weight percent P), annealed or not annealed.

FIG. 10 is a graph demonstrating improvement of the flow angle when boron content was increased from its "standart" 4% value to 8%.

BEST MODE FOR CARRYING OUT THE INVENTION

With reference to FIG. 1, it is desired to provide a protective layer for an array of integrated circuits 11 mounted on a substrate 13. The protective layer will include a layer of borophosphosilicate glass ("BPSG") covering the array of ICs 11 with a thinner layer 17 of a second insulation material, such as an oxide of silicon, contiguous to the BPSG layer 15. Preferably, the BPSG layer 15 is at least 0.7 μm thick and the second protection layer 17 is approximately 100 Å to 500 Å thick or thicker. The two layers 15 and 17 together provide a passivation layer for the IC array 11 that resists inflow to, and outflow from, the passivation layer material itself and the IC array. The second protective layer 17 is preferably an oxide layer that is deposited at relatively low temperatures T<450° C.

Chemical vapor deposition of the first and second protective layers 15 and 17 is carried out in a furnace 21, shown in FIG. 2, that may be cylindrically shaped or have some other suitable shape. The furnace 21 includes an array 23 of heating elements, arranged as coils or as longitudinal elements around the perimeter of a container 24 that has an aperture 25 at one end and has a wall closure 27 at the other end. The substrate 13 and accompanying IC array 11 are positioned in a boat 30 that rests on a cantilevered pallet 31 that moves into and out of the interior of the container 24 in a selected direction. The pallet 31 has attached thereto a container seal 33 that moves with the pallet 31 toward the aperture 25 in the container 24 and seals this aperture, when the pallet is moved into the container toward the wall closure 27 and the substrate 13 and IC array 11 are in a proper position within the interior of the container 24. The furnace 21 has five sources or containers of gases 35, 37, 39, 41 and 43 associated therewith that contain the respective gases silane ($SiH_4$), oxygen ($O_2$), nitrogen ($N_2$), trimethyl borate ($B(CH_3O)_3$ or ("TMB") and phosphine ($PH_3$). These five gases are delivered by five gas delivery lines 45, 47, 49, 51 and 53, respectively, to the interior of the container 24, with gas flows being separately controlled by the respective valves 55, 57, 59, 61 and 63 as shown in FIG. 2. The interior of the container may be pumped down or exhausted of the gases contained therein by a slow pump 67 and then by a fast pump 65 that can pump out the interior of the container 24.

Table 1 below sets forth one procedure for formation of the BPSG layer and the undoped cap layer according to the invention.

Table 1. Procedure for Formation of Borophosphosilicate Glass Layer and Undoped Cap Layer 1. Turn all gas sources off.
2. Bring spike temperature (i.e., on external perimeter of furnace) to initial temperature $T_0 = 420°$ C. at handle, center and source longitudinal positions at a rate of 4° C./minute.
3. Turn on $N_2$ purge to the slow pump at rate of $F_S = 5$ cm$^3$/min., to prevent pump oil from backstreaming into the tube.
4. Turn on $N_2$ gas at flow rate $F_N = 5000$ cm$^3$/min.
5. Move boat out of the furnace to a position of 20 cm (all the way out) at a rate of 60 cm/min.
6. Set upper pressure limit (in furnace interior) to $P_{Limit} = 5000$ microns = 5 Torr = 670 Pascals.
7. Move boat into furnace to a position of 166 cm (all the way in) from its open position at 20 cm, at a rate of 60 cm/min., then seal the furnace door.

Furnace is sealed for steps 8-35.

8. Reduce $N_2$ gas flow rate to $F_N = 0$ cm$^3$/min after a time interval of t = 3 minutes.
9. Set control so that when the spike temperatures are within 3° C. of the set points, the temperature control is switched to paddle control.
10. Turn off $N_2$ purge to the pump.
11. Turn on slow pump to provide partial vacuum for t = 190 sec.; then turn slow pump off.
12. Turn on fast pump for t = 10 minutes for fast pump down.
13. Purge furnace interior with $N_2$ gas for t = 5 minutes at flow rate $F_N = 2000$ cm$^3$/min.
14. Turn off $N_2$ flow for t = 10 minutes for fast pump down.
15. Set upper pressure limit to $P_{Limit} = 13.3$ Pascals.
16. Shut vacuum pumps off for t = 4 minutes for first leak check.
17. Turn fast pump on for t = 3 minutes to reduce pressure to < 13.3 Pascals.
18. Set upper pressure limit to $P_{Limit} = 670$ Pascals.
19. Purge furnace interior with $N_2$ gas at flow rate $F_N = 250$ cm$^3$/min for t = 12 minutes.
20. Reduce $N_2$ gas flow rate to $F_N = 0$ cm$^3$/min for t = 5 minutes.
21. Set upper pressure limit to $P_{Limit} = 6.7$ Pascals.

22. Shut vacuum pumps off for t=4 minutes for second leak check.
23. Turn fast pump on for t=5 minutes to reduce pressure to <6.7 Pascals.
24. Set upper pressure limit to $P_{Limit}=33.5$ Pascals.
25. Establish $O_2$ flow rate of $F_O=40$ cm$^3$/min, $PH_3$ flow rate of $F_P=4$ cm$^3$/min, TMB flow rate of $F_T=6$ cm$^3$/min, and $SiH_4$ flow rate of $F_S=36$ cm$^3$/min for time interval of t=123 minutes and 54 seconds; then reduce $F_P$, $F_T$ and $F_S$ to 0 cm$^3$/min. Oxygen flow continues.
26. Reduce $N_2$ purge to fast pump 65 to 0 cm$^3$/min for t=5 minutes and continue $O_2$ purge.
27. Increase $SiH_4$ flow rate to $F_S=36$ cm$^3$/min for t=110 seconds; then reduce this to $F_S=0$ cm$^3$/min for t=10 minutes and continue oxygen purge.
28. Reduce $O_2$ flow rate to $F_O=0$ cm$^3$/min and pump down for t=2 minutes.
29. Set pressure limit $P_{Limit}=670$ Pascals.
30. Establish $N_2$ gas flow rate of $F_N=1000$ cm$^3$/min for t=1 minute to purge furnace.
31. Reduce $N_2$ gas flow rate to $F_N=0$ cm$^3$/min for t=2 minutes.
32. Increase $N_2$ flow rate to $F_N=1000$ cm$^3$/min for t=2 minutes.
33. Turn on $N_2$ purge to the pump at rate $F_S=5$ cm$^3$/min for t=20 seconds; then shut pump off.
34. Return temperature control to spike.
35. Increase $N_2$ gas flow rate to $F_N=9000$ cm$^3$/min for t=4 minutes.
36. Open furnace door and move boat 11 cm out of furnace and hold for t=5 minutes.
37. Move boat 146 cm out (cumulatively) of and hold for t=15 minutes.

The temperatures inside the container 24 are monitored by a plurality of thermal couples or other temperature sensing devices 71, 73 and 75 positioned outside the furnace and contiguous thereto, which measure the so-called "spike" temperature of the furnace at different positions. Inside the container 24 a second plurality of temperature sensing devices 77, 79 and 81 are positioned to measure the so-called "paddle" temperature at positions inside the container. Ideally, the spike and paddle temperatures at corresponding positions will sense temperatures that are within a few degrees C. of one another during the process.

As a first step in the process the spike temperature is brought to an initial value $T_0$, which may be between 300° C. and 440° C. and is preferably held at $T_0=420°$ C. at three longitudinal positions, called the handle, center and source, of the furnace at a rate of 4° C./minute. Generally, the length of each time interval set forth in the procedure in Table 1 need not be precisely maintained and a tolerance of ±10 percent is acceptable here, unless otherwise indicated. All gas sources are turned off during this time interval.

The $N_2$ flow to the pump 65 is then turned on at a flow rate of $F_S=5$ cm$^3$/min in order to avoid or minimize any backstream pressures that might develop. The nitrogen source 39, through its valve 59, is then turned on at a flow rate of $F_N=5000$ cm$^3$/min, and the cantilevered pallet 31 and the boat 30 containing the substrate 13 and IC array 11 are moved out of the furnace to the position x=20 cm at a rate of 60 cm/min., to facilitate loading of the substrate 13 and the IC array 11. An upper pressure limit within the container interior is set at $P_{lim}=5000$ microns=5 Torr=670 Pascals by a pressure sensor 83 positioned within the interior of the container 24. The cantilevered pallet 31, boat 30, substrate 13 and IC array 11 are then moved into the container by a cumulative distance of x=146 cm (the maximum distance of longitudinal movement) and the cover 33 is positioned over the aperture 25 in the container 24 to form an air-tight seal for the container interior, for a time interval of about 60 minutes. During this last time interval, the container 24 is sealed with the pallet 31, boat 30, substrate 13 and IC array 11 positioned within the container.

During this last-mentioned time interval, the $N_2$ gas flow rate is reduced to $F_N=0$ cm$^3$/min after a time interval of t=3 minutes, and the controls are set so that the temperature control is switched to paddle from spike when the spike temperatures are within 3° C. of the set points. The $N_2$ flow to the fast pump 65 is turned off and the slow pump 67 is turned on for a time interval t=190 seconds to provide a partial vacuum within the container interior. The fast pump 65 is turned on for a time interval t=10 minutes. The container interior is then purged with $N_2$ gas for a time interval t=5 minutes at a flow rate of $F_N=2000$ cm$^3$/min. The $N_2$ flow is then turned off for fast pump down for t=10 minutes, and the upper pressure limit is set to $P_{lim}=13.3$ Pascals.

A first leak check is then performed for the next four minutes, and the fast pump 65 is turned on for t=3 minutes to reduce the internal pressure to no more than 13.3 Pascals. The upper pressure limit is then reset to $P_{limit}=670$ Pascals, and the container interior is purged with $N_2$ gas for t=12 minutes at a flow rate of $F_N=250$ cm$^3$/min. The $N_2$ gas flow rate is then reduced to $F_N=0$ cm$^3$/min for t=5 minutes.

The upper pressure limit is then reset to $P_{lim}=6.7$ Pascals, and a second leak check is performed over the next four minutes. The fast pump 65 is then turned on for t=5 minutes to reduce pressure to no more than 6.7 Pascals, and the upper pressure limit is reset to $P_{lim}=33.5$ Pascals.

The valves 55, 57, 61 and 63 are now opened to establish gas flow rates of 36 cm$^3$/min, 40 cm$^3$/min, 6 cm$^3$/min and 4 cm$^3$/min for the $SiH_4$, $O_2$, TMB and $PH_3$ gases, respectively, for a time interval $t_{dep}$ 123 minutes and 54 seconds. These gases react according to the following chemical reactions:

$2B(CH_3O)_3 + 5O_2 \rightarrow B_2O_3 + 9H_2O + 2CO_2$,
$2PH_3 + 3O_2 \rightarrow P_2O_3 + 3H_2O$,
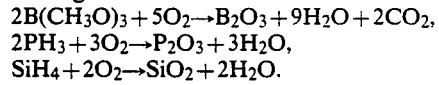

The deposition rate is approximately 55 Å/min so that during this time interval of $t_{dep}$ a layer of BPSG of thickness at least 0.2 μm, and preferably approximately 0.7 μm is deposited over the exposed surfaces of the IC array 11 and substrate 13. The valves 55, 61 and 63 are then closed, the flow rates of the $SiH_4$, TMB and $PH_3$ gases are all reduced to 0 cm$^3$/min, and the oxygen flow continues in order to purge the interior of the container 24.

The valve 55 is then reopened to establish $SiH_4$ gas flow at a rate of 36 cm$^3$/min, in the presence of the oxygen flow rate of 40 cm$^3$/min. These two gases react with each other according to the reaction

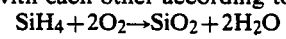

and thereby deposit a solid layer of $SiO_2$ (or, more generally, $SiO_x$) over the exposed surface of the BPSG layer 15 shown in FIG. 1. These reactions continue for t=110 seconds, after which the silane valve 55 is closed again. This results in a thickness of the undoped $SiO_x$ layer 17 of approximately 100 Å at the estimated deposition rate of 55 Å/min. Oxygen flow continues for t=10 minutes to purge the interior of the container 24. The oxygen valve 57 is then closed to shut off the oxygen flow, and the container interior is pumped down, using the large pump 65, for t=2 minutes.

The pressure limit is reset to $P_{lim}=670$ Pascals, and the valve 59 is re-opened to establish a $N_2$ gas flow rate of $F_N=1000$ cm$^3$/min for t=1 minute in order to purge the container interior. The $N_2$ gas flow rate is then reduced to 0 cm$^3$/min for t=2 minutes and is then increased to $F_N=1000$ cm$^3$/min for another two minutes. The $N_2$ purge to the pump 65 is then turned on at a flow rate of $F_S=5$ cm$^3$/min for at least t=20 seconds, and the pump 65 is then shut off.

Temperature control is returned to the spike, and the $N_2$ gas flow rate is increased to 9000 cm$^3$/min for t=4 minutes. The door or seal 33 of the container 24 is then opened, and the cantilever 31, the boat 30, the substrate 13 and the IC array 11 are moved out of the container in the selected direction a distance of 11 cm and held there for t=5 minutes. The cantilevered pallet 31, the boat 30, the substrate 13 and the IC array 11 are then moved the remainder of the distance out of the container and held there for t=15 minutes before the substrate 13 and the IC array 11, with their protective layers 15 and 17, are removed from the boat 30.

The method of formation of the BPSG and cap layers described above uses LPCVD. Other methods of formation of these layers, such as APCVD or PECVD, may also be used. The preferred temperature ranges for APCVD and for PECVD are T=400°-450° C. and T=300°-450° C., respectively. Use of APCVD, rather than LPCVD, may produce higher film thickness nonuniformity and/or larger defect density, as noted by Avigal, op.cit. Use of PECVD, rather than LPCVD, may produce higher film deposition rates and allow lower deposition temperatures, as noted by Kern and Smeltzer, op.cit.

The invention provides a method of chemical vapor deposition of an encapsulating layer over an integrated circuit array that suppresses or eliminates (1) absorption of water vapor by the bulk BPSG layer and (2) subsequent out-gassing of water vapor by this layer. The desired insulation properties of the BPSG are unaffected, or perhaps improved, by the contiguous layer of undoped silicon oxide. The invention also suppresses or eliminates out-gassing of the toxic TMB, whose presence is manifested by a characteristic, acrid smell.

Absorption of water vapor by the bulk BPSG layer is commonly monitored by the infrared absorption measurements. Absorbed water undergoes chemical reactions forming Si—O—H and O—H groups which introduce respective absorption bands within the range of 3600 cm-3700 cm$^{-1}$ and 3200 cm$^{-1}$3400 cm$^{-1}$. Exact positions of these peaks vary, depending on the microscopic environments of the respective bonds in an amorphous medium. The environments, in turn, are determined by the film density, its thermal history and stoichiometry.

Because of the low power output of the infrared sources, disturbances caused by the atmospheric ambient, and low sensitivity of the commercial infrared detectors, the Fourier Transform Infrared Spectroscopy (FTIR) is commonly used to acquire optical spectra in the mid infrared range (5000 cm$^{-1}$ (2 microns)-400 cm$^{-1}$ (25 microns). Application of the Fourier Transform principle eliminates most of the signal noise. In addition it eliminates all wavelength resolving elements, such as prisms, gratings, slits, filters, etc.

Present measurements were conducted using research grade Nicolet 60SX Fourier Transform Infrared Spectrometer. These employed Globar light source, Potassium Bromide (KBr) beamsplitter, DTGS (organic compound) detector with KBr window. Measurements were conducted at room temperature with spatial resolution of 1 cm$^{-1}$.

Optical measurement of the water absorption were conducted for: A. BPSG with standart B concentration, (4 weight percent B and 4 weight percent P), B. BPSG with increased B concentration (8 weight percent B and 4 weight percent P). All measurements were conducted for at least 5 points at the wafer, and each time consistent data were obtained. FIGS. 3-7 present results obtained for the layers with "standart" B content.

FIG. 3 exhibits the measured absorbance versus wavenumber k of a substrate encapsulated with a BPSG layer that does not have the undoped oxide layer included. The layer was exposed to air for approximately one day after deposition. Optical spectrum manifests a local peak or maximum of absorbance in the wavenumber range 3100-3300 cm$^{-1}$, which indicates the presence of loosely bonded water, as described above. FIG. 4 exhibits the measured absorbance versus wavenumber of the structure used in FIG. 3, where the characteristic absorbance of the Si substrate has been mathematically removed by subtracting absorbance spectrum of the "bare" Si wafer. This mathematical procedure was applied to all subsequently measured spectra. The magnitude of the absorbance in FIG. 4, vis-a-vis FIG. 3, is reduced as expected, but the local peak that corresponds to the presence of OH bonds is still present, indicating that OH bonds are present in the BPSG material.

FIG. 5 exhibits the measured absorbance versus wavenumber for a substrate plus BPSG layer (the same configuration as FIG. 3) plus undoped oxide layer, prepared according to the invention and subjected to the identical air exposure as the wafer without the undoped oxide layer described in the previous paragraph. The local peak corresponding to presence of O—H bonds, in the BPSG layer or in the undoped oxide layer, is absent. The very broad feature seen in FIGS. 3-5 is caused by the constructive/destructive interference between multiple light reflections from the top and bottom BPSG surfaces. It can be easily suppressed or altered by changing thickness of the BPSG film.

FIG. 6 exhibits the difference in absorbance between FIGS. 3 and 5, again showing the prominent local peak in the wavenumber range of 3100-3300 (cm$^{-1}$) that corresponds to the presence of O—H bonds. We believe that FIGS. 3-7 indicate that inclusion of a (this) layer of undoped oxide, overlying a BPSG insulation layer and prepared according to the invention, will suppress or wholly eliminate the presence of water vapor in the BPSG layer and in the undoped oxide layer for the standart film with four percent boron concentration.

The deposit of an undoped glass layer over a BPSG layer has another important benefit here: The density of undesirable voids or boron-containing microcrystals in the BPSG is decreased by more than two orders of magnitude with glass densification after post-deposition annealing in a nitrogen ambient atmosphere. In practice, this allows the use of boron concentrations as high as 8-9 weight percent in BPSG. Table 1 presents the measured densities of voids and/or microcrystals in BPSG, without and with an undoped capping layer of glass included, and without and with post-deposition annealing, for boron and phosphorous concentrations of 8 weight percent and 4 weight percent, respectively.

TABLE 1

Void/Microcrystal Count in BPSG Layer with 8 Percent B Present

| Particle Diameter | Uncapped, Annealed | Uncapped, Not Annealed | Capped, Annealed | Capped, Not Annealed |
|---|---|---|---|---|
| 0–0.5 μm | 2996 | 23 | 27 | 8 |
| 0.5–3 μm | 3979 | 21 | 22 | 19 |
| 3 μm and above | 768 | 25 | 13 | 6 |

The results shown in Table 1 indicate that: (1) providing an undoped capping layer for the BPSG layer immediately after the deposit thereof but with annealing, reduces the number of voids and/or microcrystals to approximately the same numbers as are achieved by using an uncapped, non-annealed BPSG layer; (2) for an annealed BPSG layer, use of an undoped cap layer reduces the void/microcrystal count by a multiplicative factor of 60–180, depending on the particle diameter range of interest; (3) deleting the step of annealing the capped BPSG layer reduces the number of voids and/or microcrystals to about one third the count for the uncapped/non-annealed BPSG layer; and (4) the capped/annealed BPSG layer has about half as many voids and/or microcrystals of diameter greater than 3 μm as does the uncapped/non-annealed BPSG layer. However, growth of the cap layer on the BPSG layer can be carried out at much lower temperatures (T 300°–440° C.) than the corresponding annealing temperatures (T 800°–1100° C.). This is a big advantage where low melt point materials such as aluminum are used in the underlying IC structure.

As noted above, uncapped BPSG layers with high B content (above 5 weight percent) exhibit a tendency to absorb large amounts of the water vapor, which has undesirable effects on performance of any device made using that wafer. Water vapor absorption in the BPSG layer can lead to formation of boron-rich crystallites and other deleterious effects. Maintenance of high boron content in the BPSG encapsulation layer may be desirable because this promotes easier reflow of the material, as discussed elsewhere in this specification. Annealing or densification of a dielectric layer is usually necessary for other reasons but is often undesirable for high boron content films, because it increases the crystallite or void count in the BPSG layers, as shown in Table 1, especially in the presence of high boron content in the BPSG layer. Use of the undoped cap layer on the BPSG layer reduces the crystallite or void count by as much as the orders of magnitude, as illustrated in Table 1.

Series of the optical measurements was conducted to elucidate on the water vapor absorption by the BPSG layers with boron content exceeding "standart" 4–5 weight percent level. The B and P content of the samples for this experiment, as determined by FTIR, and some other relevant fabrication details are set forth in Table 2. The small differences in B content, or in P content, among these samples are not believed to significantly influence the results.

FIGS. 7, 8 and 9 present the results of moisture related absorbance measurements in the BPSG layer with "high" boron content (described in Table 2) with and without protective undoped oxide layer, subjected or not to annealing. Annealing applied in this experiment imitates standart densification process - 800° C. for 45 minutes in $N_2$ ambient. Secondary Ion Mass Spectroscopy (SIMS) and Auger Electron Spectroscopy measurements showed that annealing caused some diffusion of the B and P into an undoped oxide cap, but did not change significantly their concentrations in the cap region near the surface.

TABLE 2

Boron/Phosphorous Content for Four Differently Fabricated BPSG-encapsulated Wafers

| Sample No. | Boron Concentration (wt-percent) | Phosphorous Concentration (wt-percent) | Fabrication Details |
|---|---|---|---|
| 1 | 8.1 | 4.5 | Not annealed. Capped (with undoped cap layer) |
| 2 | 8.5 | 4.4 | Not annealed. Not capped. |
| 3 | 8.2 | 4.7 | Annealed. Capped. |
| 4 | 7.9 | 4.8 | Annealed. Not capped. |

FTIR measurements probed water vapor related characteristic absorption bands at 3650 cm$^{-1}$ (Si—O—H) and at around 3350 cm$^{-1}$ (O—H). Note that the non-annealed samples reported in FIG. 8 have about three times as much absorbance as the corresponding annealed samples, and they tend to form O—H bonds rather than Si—O—H bonds. These differences reflect change in a film density and in bond configurations caused by the annealing. Two BPSG degradation processes were employed: (1) immersion in water: 14 hours in cold water followed by 3 hours in boiling water followed by 2 hours in boiling water—FIGS. 7 and 8; and (2) prolonged air exposure (up to 25 days)—FIG. 9. In all of these situations, the capped layer has significantly smaller water-related (both Si—O—H and O—H absorption) absorbance than the corresponding uncapped layer. These FIGS. 7, 8 and 9 again demonstrate the advantages of provision of an undoped cap layer according to the invention in a variety of water vapor exposure situations, with and without subsequent annealing.

Use of the undoped capping layer on the BPSG layer also allows use of much higher boron concentrations, as high as 8–9 weight percent, with no substantial increase in void/microcrystal density in the BPSG layer, after annealing. This allows use of lower reflow temperatures, as low as $T_r=700°-900°$ C., and reduces the compressive stress in the BPSG layer introduced by presence of the phosphorous. Because the compressive stress in BPSG is lowered by use of the undoped cap layer, a higher concentration of phosphorous (as high as 9 weight percent) can be tolerated, in order to provide more complete sodium ion gettering and still lower reflow temperatures in the BPSG layer. Boron concentration as high as 8–9 weight percent in the presence of a wet ambient atmosphere (containing $H_2O$ vapor) can be tolerated here because the cap layer acts as a water vapor barrier and thus suppresses formation of boron-rich microcrystals or voids in the BPSG layer. The concentrations of boron and phosphorous in the BPSG layer may each be between 1 and 9 weight percent, with phosphorous concentration of at least 3–5 weight percent being preferred for sodium ion gettering.

In integrated circuit (IC) fabrication process, the angle of the film 15 over a step 11, as in FIG. 1, should be minimized. This flow angle of the BPSG film is inversely proportional to the boron concentration in the film as well as the temperature of the flow condition. Therefore, to reduce the flow angle, the boron concentration or the flow temperature has to be raised. However, in the state of the art IC process, the circuits have to be processed under a temperature no more than 800° C. Therefore, the alternative is to raise the boron concentration in the BPSG film in order to reduce the flow angle. However, BPSG films with more than 5 percent boron have shown to be unstable in the normal processing environment.

This invention of using an undoped oxide capping layer on the BPSG film enables the film to contain more than 5 percent boron without being unstable. The flow angles of 8 percent and 4 percent boron BPSG films are compared in FIG. 10 at various flow temperatures. Clearly, the 8 percent boron BPSG is able to achieve a lower flow angle at a certain flow temperature compared to the 4 percent boron BPSG film.

The foregoing discussions have focused on deposit of an undoped silicon oxide layer as the cap layer. An undoped silicon nitride layer may also be used as the cap layer. In fact, silicon nitride is known to be a better barrier against diffusion of intentional dopants and unwanted impurities, such as alkali metals, than is silicon oxide. Direct deposition of undoped silicon nitride as a cap layer is commonly carried out by the chemical vapor deposition process (CVD) at higher temperatures, $T_{dep} \geq 750°$ C., than the deposition temperatures used for oxides of silicon. The chemical reaction relied upon for deposition of silicon nitride is usually
$3 \text{ SiH}_4 + 4 \text{ NH}_3 \rightarrow \text{Si}_3\text{N}_4 + 12 \text{ H}_2$.

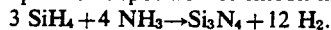

Use of the higher deposition temperatures offers opportunity to rearrange processing sequence, namely, to densify BPSG films before deposition of the silicon nitride cap layer. The silicon nitride deposition temperature is comparable with the densification temperature. The proposed process is as follows:

(1) BPSG is deposited on the wafers in the reactor;
(2) Without breaking the reactor seal and exposing wafers to the outside atmosphere, reactor temperature is raised and wafers with the BPSG layer are annealed (densified) in the reactor; annealing is conducted in a neutral ambient atmosphere, such as $N_2$ or Ar; and
(3) Silicon nitride cap layer is deposited.

The proposed process for the CVD deposition of the silicon nitride cap layer is fully compatible with the CVD reactor arrangement shown in FIG. 2, with the addition of an $NH_3$ source 44 and valve 46.

Silicon nitride can also be deposited using a plasma-enhanced chemical vapor deposition (PECVD) system with a deposition temperature of $T_{dep} = 275°-400°$ C. The PECVD process allows use of lower deposition temperatures than the CVD but requires growth apparatus of increased complexity, with plasma generation capabilities. Because of this lower deposition temperature, the processing sequence employed for the silicon oxide cap layer (i.e., BPSG deposition followed by silicon oxide cap deposition followed by densification) can be used for PECVD silicon nitride deposit as well.

We estimate that an undoped layer of silicon nitride of thickness 50-100 Å will provide adequate encapsulation of the BPSG layer and the underlying IC array. We anticipate that the thermal stresses present in such thin layers will have a negligible effect on the integrity of the underlying structures. Use of a smaller thickness (<50 Å) of silicon nitride may also be possible, but layers of thickness less than 50 Å tend to form islands of the layering material that are separated by regions where the deposition is incomplete and the underlying material is at least partly exposed. For this reason, we prefer to deposit cap layers of silicon nitride (and silicon oxide as well) of thickness at least 50 Å.

I claim:

1. A method of encapsulating an integrated circuit array that suppresses the absorption of water vapor by the encapsulating layer, the method comprising the steps of:

forming a layer of borophosphosilicate glass having a boron concentration in the range of 5-9 weight percent, said borophosphosilicate layer being at least 0.2 $\mu$m thick over the array in a vacuum; and immediately, without breaking the vacuum, forming a layer of undoped oxide of silicon, of thickness more than 100 Å over the borophosphosilicate layer, after formation of the borophosphosilicate layer.

2. The method of claim 1, further comprising the step of choosing the temperature at which said layer of undoped silicon oxide is formed at between $T_f = 300°$ C. and $T_f = 450°$ C.

3. The method of claim 2, further comprising the step of choosing said temperature $T_f$ as approximately 420° C.

4. The method of claim 1, further comprising the step of choosing said phosphorous concentration in said borophosphosilicate glass in the range of 1-9 weight percent.

5. The method of claim 1, further comprising the step of annealing said encapsulated integrated circuit array at a temperature of at least $T_a = 700°$ C.

6. A method of encapsulating an integrated circuit array that allows use of reflow processing temperatures in the approximate range $T_r = 700°-900°$ C. on the encapsulated structure, the method comprising the steps of:

forming a layer of borophosphosilicate glass having a boron concentration of 5-9 weight percent, said borophosphosilicate layer being at least 0.2 $\mu$m thick over the circuit array in a vacuum;

adjusting the temperature of the borophosphosilicate layer to a temperature $T < 750°$ C.;

subjecting the encapsulating layer to reflow processing at a reflow temperature in the range $T_r = 700°-900°$ C.; and immediately, without breaking the vacuum, forming a layer of an undoped nitride of silicon, of thickness more than 50Å over the borophosphosilicate layer, after formation of the borophosphosilicate layer.

7. A method of encapsulating an integrated circuit array that allows use of reflow processing temperatures in the approximate range $T_r = 700°-900°$ C. on the encapsulated structure, the method comprising the steps of:

forming a layer of borophosphosilicate glass having a boron concentration of 5-9 weight percent, said borophosphosilicate layer being at least 02. $\mu$m thick over the circuit array in a vacuum;

subjecting the encapsulating layer to reflow processing at a reflow temperature in the range $T = 700°-900°$ C.; and immediately, without breaking the vacuum, forming a layer of an undoped oxide of silicon, of thickness more than 100 Å over the borophosphosilicate layer, after formation of the borophosphosilicate layer.

8. A method of encapsulating an integrated circuit array that suppresses the absorption of water vapor by the encapsulating layer, the method comprising the steps of:
    forming a layer of borophosphosilicate glass having a boron concentration in the range of 5-9 weight percent, said borophosphosilicate layer being at least 0.2 μm thick over the array in a vacuum;
    adjusting the temperature of the borophosphosilicate layer to a temperature $T \geq 750°$ C.; and
    immediately, without breaking the vacuum, forming a layer of an undoped nitride of silicon, of thickness more than 50 Å over the borophosphosilicate layer, after formation of the borophosphosilicate layer.

9. The method of claim 8, further comprising the step of choosing said phosphorous concentration in said borophosphosilicate glass in the range of 1-9 weight percent.

10. The method of claim 8, further comprising the step of annealing said encapsulated integrated circuit array, after formation of said borophosphosilicate layer, at a temperature of at least $T_a = 750°$ C.

11. A method of encapsulating an integrated circuit array that suppresses the absorption of water vapor by the encapsulating layer, the method comprising the steps of:
    forming a layer of borophosphosilicate glass having a boron concentration in the range of 5-9 weight percent, said borophosphosilicate layer being at least 0.2 μm thick over the array in a vacuum;
    adjusting the temperature of the borophosphosilicate layer to the approximate temperature range $275° \text{C.} \leq T \leq 400°$ C.; and
    immediately, without breaking the vacuum, forming a layer of an undoped nitride of silicon, of thickness more than 50 Å after formation of the borophosphosilicate layer, by plasma-enhanced chemical vapor deposition.

12. The method of claim 11, further comprising the step of choosing said phosphorous concentration in said borophosphosilicate glass in the range of 1-9 weight percent.

* * * * *